United States Patent
Roohparvar et al.

(10) Patent No.: US 7,782,674 B2
(45) Date of Patent: *Aug. 24, 2010

(54) SENSING OF MEMORY CELLS IN NAND FLASH

(75) Inventors: Frankie F. Roohparvar, Monte Sereno, CA (US); Vishal Sarin, Cupertino, CA (US)

(73) Assignee: Micron Technology, Inc., Boise, ID (US)

(*) Notice: Subject to any disclaimer, the term of this patent is extended or adjusted under 35 U.S.C. 154(b) by 84 days.

This patent is subject to a terminal disclaimer.

(21) Appl. No.: 11/975,204

(22) Filed: Oct. 18, 2007

(65) Prior Publication Data

US 2009/0103365 A1 Apr. 23, 2009

(51) Int. Cl.
*G11C 16/04* (2006.01)
(52) U.S. Cl. .............. 365/185.17; 365/185.18; 365/185.03
(58) Field of Classification Search ............ 365/185.17, 365/185.18, 185.03
See application file for complete search history.

(56) References Cited

U.S. PATENT DOCUMENTS 6,819,592 B2 * 11/2004 Noguchi et al. ........ 365/185.17
2002/0159315 A1 10/2002 Noguchi et al.
2009/0086542 A1 * 4/2009 Lee et al. ............... 365/185.17
2009/0097318 A1 4/2009 Sarin et al.

OTHER PUBLICATIONS

U.S. Appl. No. 11/973,677, filed Oct. 10, 2007, Sarin et al.

* cited by examiner

*Primary Examiner*—Huan Hoang
(74) *Attorney, Agent, or Firm*—Leffert Jay & Polglaze, P.A.

(57) ABSTRACT

An analog voltage NAND architecture non-volatile memory data read/verify process and circuits is described that senses analog voltages in non-volatile cells utilizing source follower voltage sensing. In a source follower sensing or read operation the programmed threshold voltage of a cell in a NAND string of a NAND architecture Flash memory array is read by applying an elevated voltage to the source line, an elevated pass voltage (Vpass) is placed on the gates of the unselected cells of the string to place them in a pass through mode of operation, and a read gate voltage (Vg) is applied to the gate of the selected cell. The selected memory cell operates as a source follower to set a voltage on the coupled bit line at the read gate voltage minus the threshold voltage of the cell (Vg−Vt), allowing the voltage of the cell to be directly sensed or sampled.

23 Claims, 8 Drawing Sheets

SENSING OF MEMORY CELLS IN NAND FLASH

TECHNICAL FIELD

The present disclosure relates generally to semiconductor memory, and in one or more particular embodiments, the present disclosure relates to solid state non-volatile memory devices and systems utilizing analog signals to communicate data values, such as those representing two or more bits of information.

BACKGROUND

Electronic devices commonly have some type of bulk storage device available to them. A common example is a hard disk drive (HDD). HDDs are capable of large amounts of storage at relatively low cost, with current consumer HDDs available with over one terabyte of capacity.

HDDs generally store data on rotating magnetic media or platters. Data is typically stored as a pattern of magnetic flux reversals on the platters. To write data to a typical HDD, the platter is rotated at high speed while a write head floating above the platter generates a series of magnetic pulses to align magnetic particles on the platter to represent the data. To read data from a typical HDD, resistance changes are induced in a magnetoresistive read head as it floats above the platter rotated at high speed. In practice, the resulting data signal is an analog signal whose peaks and valleys are the result of the magnetic flux reversals of the data pattern. Digital signal processing techniques called partial response maximum likelihood (PRML) are then used to sample the analog data signal to determine the likely data pattern responsible for generating the data signal.

HDDs have certain drawbacks due to their mechanical nature. HDDs are susceptible to damage or excessive read/write errors due to shock, vibration or strong magnetic fields. In addition, they are relatively large users of power in portable electronic devices.

Another example of a bulk storage device is a solid state drive (SSD). Instead of storing data on rotating media, SSDs utilize semiconductor memory devices to store their data, but include an interface and form factor making them appear to their host system as if they are a typical HDD. The memory devices of SSDs are typically non-volatile flash memory devices.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

Unlike HDDs, the operation of SSDs is generally not subject to vibration, shock or magnetic field concerns due to their solid state nature. Similarly, without moving parts, SSDs have lower power requirements than HDDs. However, SSDs currently have much lower storage capacities compared to HDDs of the same form factor and a significantly higher cost per bit.

For the reasons stated above, and for other reasons which will become apparent to those skilled in the art upon reading and understanding the present specification, there is a need in the art for alternative bulk storage options.

DETAILED DESCRIPTION

Figure 1:
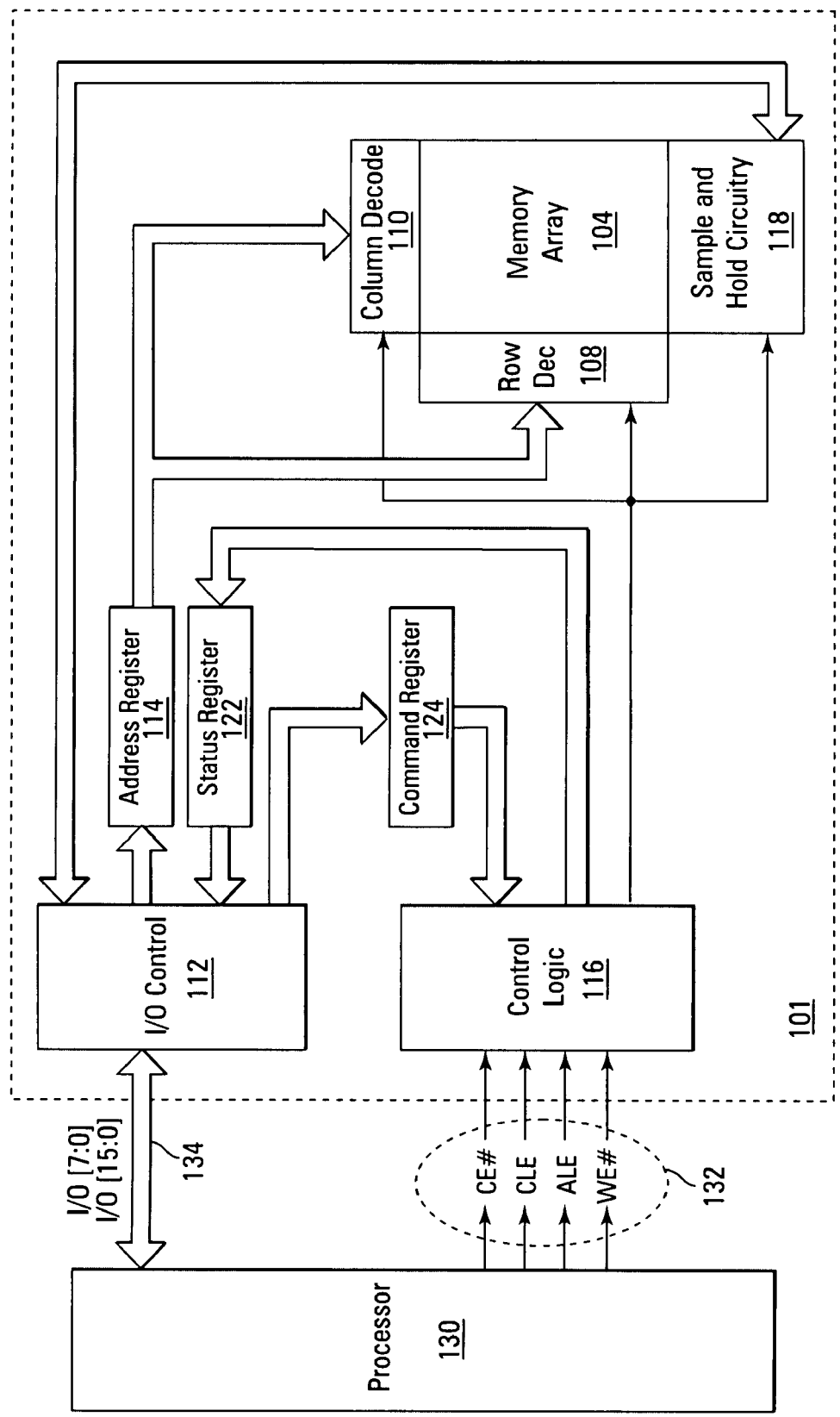
FIG. 1 is a simplified block diagram of a memory device according to an embodiment of the disclosure.

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Traditional solid-state memory devices pass data in the form of binary signals. Typically, a ground potential represents a first logic level of a bit of data, e.g., a '0' data value, while a supply potential represents a second logic level of a bit of data, e.g., a '1' data value. A multi-level cell (MLC) may be assigned, for example, four different threshold voltage (Vt) ranges of 200 mV for each range, with each range corresponding to a distinct data state, thereby representing four data values or bit patterns. Typically, a dead space or margin of 0.2V to 0.4V is between each range to keep the Vt distributions from overlapping. If the Vt of the cell is within the first range, the cell may be deemed to store a logical 11 state and is typically considered the erased state of the cell. If the Vt is within the second range, the cell may be deemed to store a logical 10 state. If the Vt is within the third range, the cell may be deemed to store a logical 00 state. And if the Vt is within the fourth range, the cell may be deemed to store a logical 01 state.

When programming a traditional MLC device as described above, cells are generally first erased, as a block, to correspond to the erased state. Following erasure of a block of cells, the least-significant bit (LSB) of each cell is first programmed, if necessary. For example, if the LSB is a 1, then no programming is necessary, but if the LSB is a 0, then the Vt of the target memory cell is moved from the Vt range corresponding to the 11 logic state to the Vt range corresponding to the 10 logic state. Following programming of the LSBs, the most-significant bit (MSB) of each cell is programmed in a similar manner, shifting the Vt where necessary. When reading an MLC of a traditional memory device, one or more read operations determine generally into which of the ranges the Vt of the cell voltage falls. For example, a first read operation may determine whether the Vt of the target memory cell is indicative of the MSB being a 1 or a 0 while a second read operation may determine whether the Vt of the target memory cell in indicative of the LSB being a 1 or a 0. In each case, however, a single bit is returned from a read operation of a target memory cell, regardless of how many bits are stored on each cell. This problem of multiple program and read operations becomes increasingly troublesome as more bits are stored on each MLC. Because each such program or read operation is a binary operation, i.e., each programs or returns a single bit of information per cell, storing more bits on each MLC leads to longer operation times.

The memory devices of an illustrative embodiment store data as Vt ranges on the memory cells. In contrast to traditional memory devices, however, program and read operations are capable of utilizing data signals not as discrete bits of MLC data values, but as full representations of MLC data values, such as their complete bit patterns. For example, in a two-bit MLC device, instead of programming a cell's LSB and subsequently programming that cell's MSB, a target threshold voltage may be programmed representing the bit pattern of those two bits. That is, a series of program and verify operations would be applied to a memory cell until that memory cell obtained its target threshold voltage rather than programming to a first threshold voltage for a first bit, shifting to a second threshold voltage for a second bit, etc. Similarly, instead of utilizing multiple read operations to determine each bit stored on a cell, the threshold voltage of the cell may be determined and passed as a single signal representing the complete data value or bit pattern of the cell. The memory devices of the various embodiments do not merely look to whether a memory cell has a threshold voltage above or below some nominal threshold voltage as is done in traditional memory devices. Instead, a voltage signal is generated that is representative of the actual threshold voltage of that memory cell across the continuum of possible threshold voltages. An advantage of this approach becomes more significant as the bits per cell count is increased. For example, if the memory cell were to store eight bits of information, a single read operation would return a single analog data signal representative of eight bits of information.

FIG. 1 is a simplified block diagram of a memory device 101 according to an embodiment of the disclosure. Memory device 101 includes an array of memory cells 104 arranged in rows and columns. Although the various embodiments will be described primarily with reference to NAND memory arrays, the various embodiments are not limited to a specific architecture of the memory array 104. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 108 and a column decode circuitry 110 are provided to decode address signals provided to the memory device 101. Address signals are received and decoded to access memory array 104. Memory device 101 also includes input/output (I/O) control circuitry 112 to manage input of commands, addresses and data to the memory device 101 as well as output of data and status information from the memory device 101. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses.

Control logic 116 is also coupled to a sample and hold circuitry 118. The sample and hold circuitry 118 latches data, either incoming or outgoing, in the form of analog voltage levels. For example, the sample and hold circuitry could contain capacitors or other analog storage devices for sampling either an incoming voltage signal representing data to be written to a memory cell or an outgoing voltage signal indicative of the threshold voltage sensed from a memory cell. The sample and hold circuitry 118 may further provide for amplification and/or buffering of the sampled voltage to provide a stronger data signal to an external device.

The handling of analog voltage signals may take an approach similar to an approach well known in the area of CMOS imager technology, where charge levels generated at pixels of the imager in response to incident illumination are stored on capacitors. These charge levels are then converted to voltage signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a voltage level indicative of an actual or target threshold voltage of a memory cell for reading or programming, respectively, the memory cell. This charge could then be converted to an analog voltage using a differential amplifier having a grounded input or other reference signal as a second input. The output of the differential amplifier could then be passed to the I/O control circuitry 112 for output from the memory device, in the case of a read operation, or used for comparison during one or more verify operations in programming the memory device. It is noted that the I/O control circuitry 112 could optionally include analog-to-digital conversion functionality and digital-to-analog conversion (DAC) functionality to convert read data from an analog signal to a digital bit pattern and to convert write data from a digital bit pattern to an analog signal such that the memory device 101 could be adapted for communication with either an analog or digital data interface.

During a write operation, target memory cells of the memory array 104 are programmed until voltages indicative of their Vt levels match the levels held in the sample and hold circuitry 118. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the Vt levels of the target memory cells are passed to the sample and hold circuitry 118 for transfer to an external processor (not shown in FIG. 1) either directly as analog signals or as digitized representations of the analog signals depending upon whether ADC/DAC functionality is provided external to, or within, the memory device.

Threshold voltages of cells may be determined in a variety of manners. For example, a word line voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 118 may include caching, i.e., multiple storage locations for each data value, such that the memory device 101 may be reading a next data value while passing a first data value to the external processor, or receiving a next data value while writing a first data value to the memory array 104. A status register 122 is coupled between I/O control circuitry 112 and control logic 116 to latch the status information for output to the external processor.

Memory device 101 receives control signals at control logic 116 over a control link 132. The control signals may include a chip enable CE#, a command latch enable CLE, an address latch enable ALE, and a write enable WE#. Memory device 101 may receive commands (in the form of command signals), addresses (in the form of address signals), and data (in the form of data signals) from an external processor over a multiplexed input/output (I/O) bus 134 and output data to the external processor over I/O bus 134.

In a specific example, commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data may be received over input/output (I/O) pins [7:0] for a device capable of receiving eight parallel signals, or input/output (I/O) pins [15:0] for a device capable of receiving sixteen parallel signals, at I/O control circuitry 112 and are transferred to sample and hold circuitry 118. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 1 has been simplified to help focus on the embodiments of the disclosure. Additionally, while the memory device of FIG. 1 has been described in accordance with popular conventions for receipt and output of the various signals, it is noted that the various embodiments are not limited by the specific signals and I/O configurations described unless expressly noted herein. For example, command and address signals could be received at inputs separate from those receiving the data signals, or data signals could be transmitted serially over a single I/O line of I/O bus 134. Because the data signals represent bit patterns instead of individual bits, serial communication of an 8-bit data signal could be as efficient as parallel communication of eight signals representing individual bits.

Figure 2:
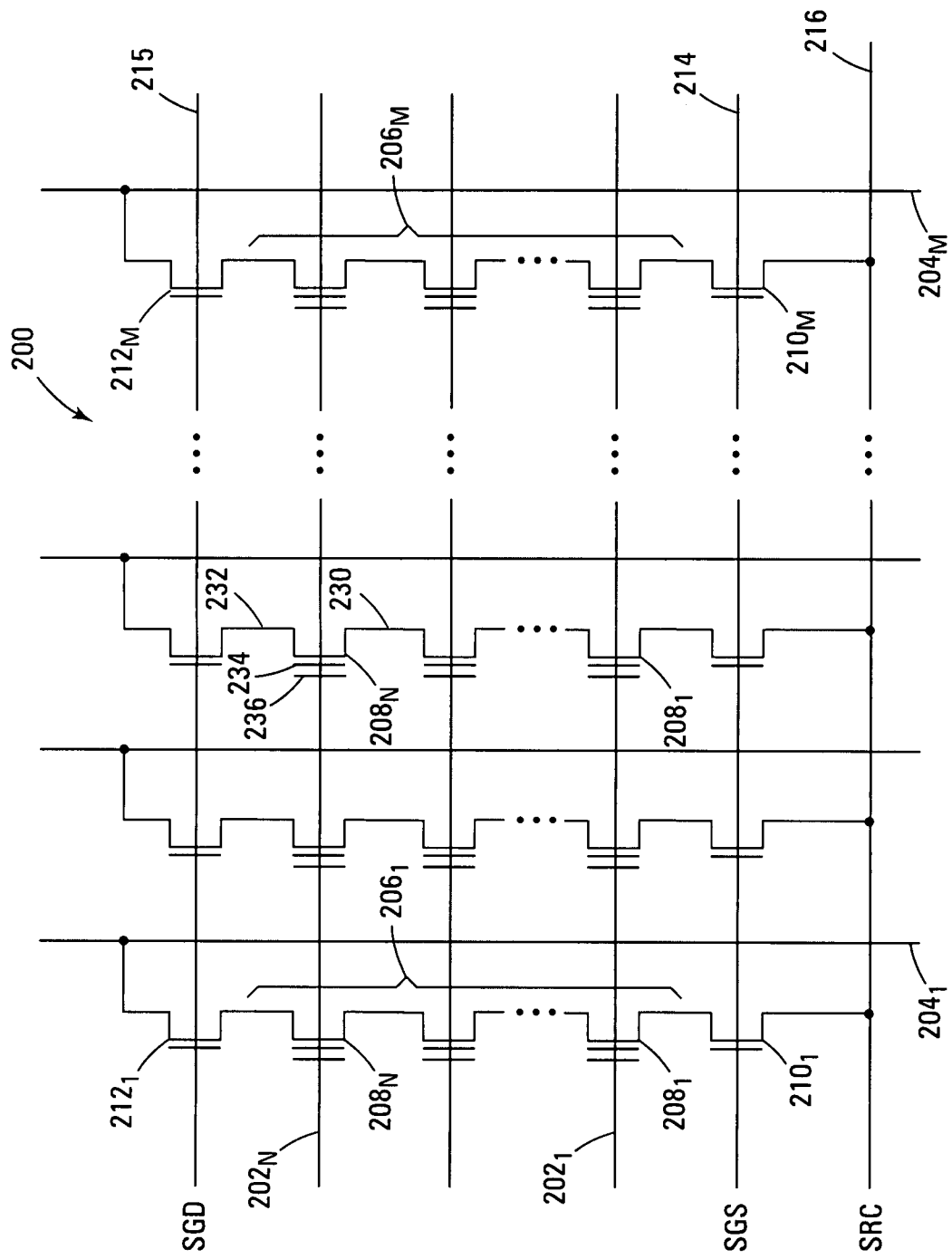
FIG. 2 is a schematic of a portion of an example NAND memory array as might be found in the memory device of FIG. 1.

FIG. 2 is a schematic of a portion of an example NAND memory array 200 as might be found in the memory array 104 of FIG. 1. As shown in FIG. 2, the memory array 200 includes word lines $202_1$ to $202_N$ and intersecting bit lines $204_1$ to $204_M$. For ease of addressing in the digital environment, the number of word lines 202 and the number of bit lines 204 are generally each some power of two.

Memory array 200 includes NAND strings $206_1$ to $206_M$. Each NAND string includes transistors $208_1$ to $208_N$, each located at an intersection of a word line 202 and a bit line 204. The transistors 208, depicted as floating-gate transistors in FIG. 2, represent non-volatile memory cells for storage of data. The floating-gate transistors 208 of each NAND string 206 are connected in series source to drain between one or more source select gates 210, e.g., a field-effect transistor (FET), and one or more drain select gates 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate of each source select gate 210 is connected to source select line 214. If multiple source select gates 210 are utilized for a given NAND string 206, they would be coupled in series between the common source line 216 and the first floating-gate transistor 208 of that NAND string 206.

The drain of each drain select gate 212 is connected to a local bit line 204 for the corresponding NAND string at a drain contact. For example, the drain of drain select gate $212_1$ is connected to the local bit line $204_1$ for the corresponding NAND string $206_1$ at a drain contact. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$. If multiple drain select gates 212 are utilized for a given NAND string 206, they would be coupled in series between the corresponding bit line 204 and the last floating-gate transistor $208_N$ of that NAND string 206.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202. Other forms of transistors 208 may also be utilized with embodiments of the disclosure, such as NROM, magnetic or ferroelectric transistors and other transistors capable of being programmed to assume one of two or more threshold voltage ranges.

Figure 3:
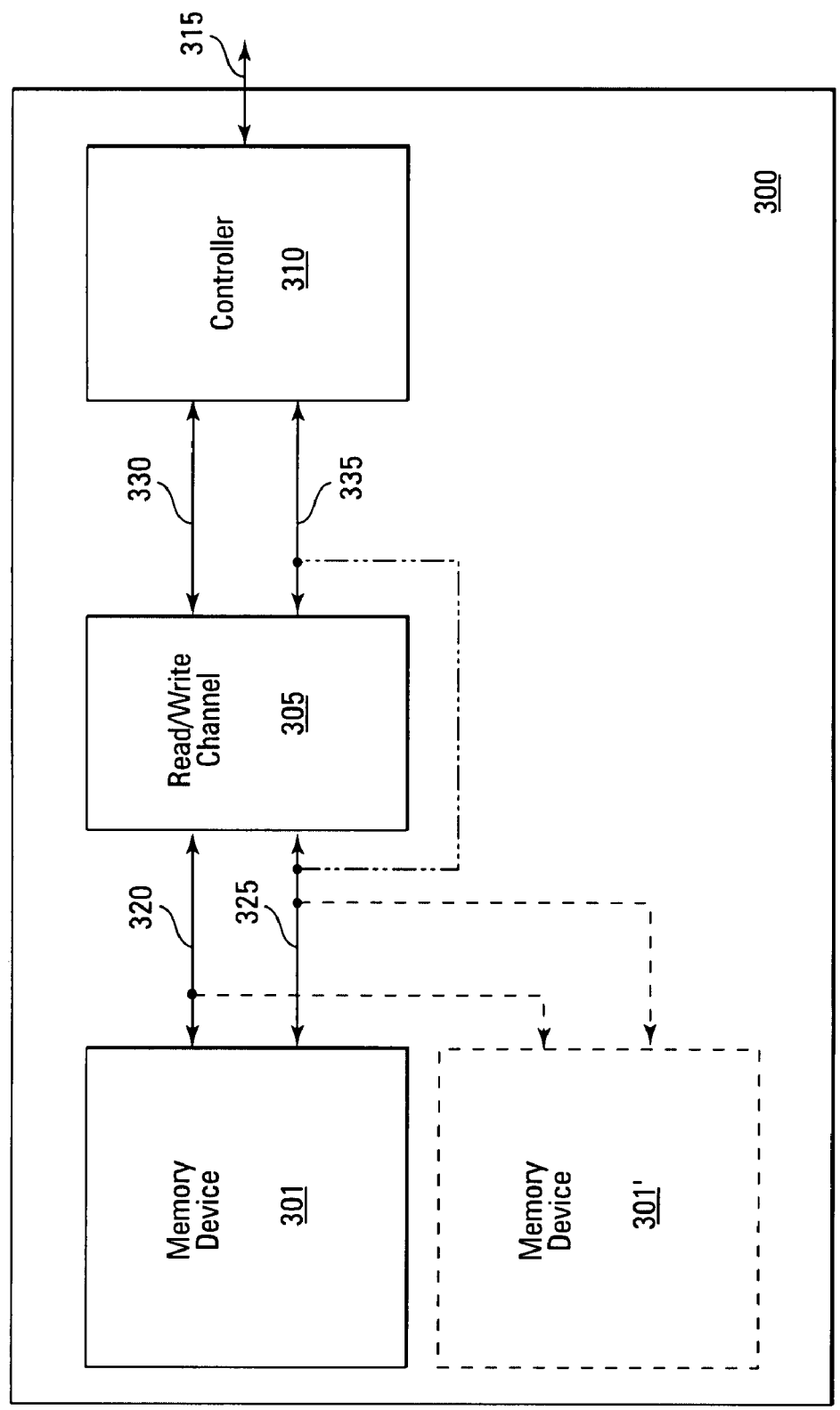
FIG. 3 is a block schematic of a solid state bulk storage device in accordance with one embodiment of the present disclosure.

Memory devices of the various embodiments may be advantageously used in bulk storage devices. For various embodiments, these bulk storage devices may take on the same form factor and communication bus interface of traditional HDDs, thus allowing them to replace such drives in a variety of applications. Some common form factors for HDDs include the 3.5", 2.5" and PCMCIA (Personal Computer Memory Card International Association) form factors commonly used with current personal computers and larger digital media recorders, as well as 1.8" and 1" form factors commonly used in smaller personal appliances, such as mobile telephones, personal digital assistants (PDAs) and digital media players. Some common bus interfaces include universal serial bus (USB), AT attachment interface (ATA) [also known as integrated drive electronics or IDE], serial ATA (SATA), small computer systems interface (SCSI) and the Institute of Electrical and Electronics Engineers (IEEE) 1394 standard. While a variety of form factors and communication interfaces were listed, the embodiments are not limited to a specific form factor or communication standard. Furthermore, the embodiments need not conform to a HDD form factor or communication interface. FIG. 3 is a block schematic of a solid state bulk storage device 300 in accordance with one embodiment of the present disclosure.

The bulk storage device 300 includes a memory device 301 in accordance with an embodiment of the disclosure, a read/write channel 305 and a controller 310. The read/write channel 305 provides for analog-to-digital conversion of data signals received from the memory device 301 as well as digital-to-analog conversion of data signals received from the controller 310. The controller 310 provides for communication between the bulk storage device 300 and an external processor (not shown in FIG. 3) through bus interface 315. It is noted that the read/write channel 305 could service one or more additional memory devices, as depicted by memory device 301' in dashed lines. Selection of a single memory device 301 for communication can be handled through a multi-bit chip enable signal or other multiplexing scheme.

The memory device 301 is coupled to a read/write channel 305 through an analog interface 320 and a digital interface 325. The analog interface 320 provides for the passage of analog data signals between the memory device 301 and the read/write channel 305 while the digital interface 325 provides for the passage of control signals, command signals and address signals from the read/write channel 305 to the memory device 301. The digital interface 325 may further provide for the passage of status signals from the memory device 301 to the read/write channel 305. The analog interface 320 and the digital interface 325 may share signal lines as noted with respect to the memory device 101 of FIG. 1. Although the embodiment of FIG. 3 depicts a dual analog/digital interface to the memory device, functionality of the read/write channel 305 could optionally be incorporated into the memory device 301 as discussed with respect to FIG. 1 such that the memory device 301 communicates directly with the controller 310 using only a digital interface for passage of control signals, command signals, status signals, address signals and data signals.

The read/write channel 305 is coupled to the controller 310 through one or more interfaces, such as a data interface 330 and a control interface 335. The data interface 330 provides for the passage of digital data signals between the read/write channel 305 and the controller 310. The control interface 335 provides for the passage of control signals, command signals and address signals from the controller 310 to the read/write channel 305. The control interface 335 may further provide for the passage of status signals from the read/write channel 305 to the controller 310. Status and command/control signals may also be passed directly between the controller 310 and the memory device 301 as depicted by the dashed line connecting the control interface 335 to the digital interface 325.

Although depicted as two distinct devices in FIG. 3, the functionality of the read/write channel 305 and the controller 310 could alternatively be performed by a single integrated circuit device. And while maintaining the memory device 301 as a separate device would provide more flexibility in adapting the embodiments to different form factors and communication interfaces, because it is also an integrated circuit device, the entire bulk storage device 300 could be fabricated as a single integrated circuit device.

The read/write channel 305 is a signal processor adapted to at least provide for conversion of a digital data stream to an analog data stream and vice versa. A digital data stream provides data signals in the form of binary voltage levels, i.e., a first voltage level indicative of a bit having a first binary data value, e.g., 0, and a second voltage level indicative of a bit having a second binary data value, e.g., 1. An analog data stream provides data signals in the form of analog voltages having more than two levels, with different voltage levels or ranges corresponding to different bit patterns of two or more bits. For example, in a system adapted to store two bits per memory cell, a first voltage level or range of voltage levels of an analog data stream could correspond to a bit pattern of 11, a second voltage level or range of voltage levels of an analog data stream could correspond to a bit pattern of 10, a third voltage level or range of voltage levels of an analog data stream could correspond to a bit pattern of 00 and a fourth voltage level or range of voltage levels of an analog data stream could correspond to a bit pattern of 01. Thus, one analog data signal in accordance with the various embodiments would be converted to two or more digital data signals, and vice versa.

In practice, control and command signals are received at the bus interface 315 for access of the memory device 301 through the controller 310. Addresses and data values may also be received at the bus interface 315 depending upon what type of access is desired, e.g., write, read, format, etc. In a shared bus system, the bus interface 315 would be coupled to a bus along with a variety of other devices. To direct communications to a specific device, an identification value may be placed on the bus indicating which device on the bus is to act upon a subsequent command. If the identification value matches the value taken on by the bulk storage device 300, the controller 310 would then accept the subsequent command at the bus interface 315. If the identification value did not match, the controller 310 would ignore the subsequent communication. Similarly, to avoid collisions on the bus, the various devices on a shared bus may instruct other devices to cease outbound communication while they individually take control of the bus. Protocols for bus sharing and collision avoidance are well known and will not be detailed herein. The controller 310 then passes the command, address and data signals on to the read/write channel 305 for processing. Note that the command, address and data signals passed from the controller 310 to the read/write channel 305 need not be the same signals received at the bus interface 315. For example, the communication standard for the bus interface 315 may differ from the communication standard of the read/write channel 305 or the memory device 301. In this situation, the controller 310 may translate the commands and/or addressing scheme prior to accessing the memory device 301. In addition, the controller 310 may provide for load leveling within the one or more memory devices 301, such that physical addresses of the memory devices 301 may change over time for a given logical address. Thus, the controller 310 would map the logical address from the external device to a physical address of a target memory device 301.

For write requests, in addition to the command and address signals, the controller 310 would pass digital data signals to the read/write channel 305. For example, for a 16-bit data word, the controller 310 would pass 16 individual signals having a first or second binary logic level. The read/write channel 305 would then convert the digital data signals to an analog data signal representative of the bit pattern of the digital data signals. To continue with the foregoing example, the read/write channel 305 would use a digital-to-analog conversion to convert the 16 individual digital data signals to a single analog signal having a potential level indicative of the desired 16-bit data pattern. For one embodiment, the analog data signal representative of the bit pattern of the digital data signals is indicative of a desired threshold voltage of the target memory cell. However, in programming of a one-transistor memory cells, it is often the case that programming of neighboring memory cells will increase the threshold voltage of previously programmed memory cells. Thus, for another embodiment, the read/write channel 305 can take into account these types of expected changes in the threshold voltage, and adjust the analog data signal to be indicative of a threshold voltage lower than the final desired threshold voltage. After conversion of the digital data signals from the controller 310, the read/write channel 305 would then pass the write command and address signals to the memory device 301 along with the analog data signals for use in programming the individual memory cells. Programming can occur on a cell-by-cell basis, but is generally performed for a page of data per operation. For a typical memory array architecture, a page of data includes every other memory cell coupled to a word line.

For read requests, the controller would pass command and address signals to the read/write channel 305. The read/write channel 305 would pass the read command and address signals to the memory device 301. In response, after performing the read operation, the memory device 301 would return the analog data signals indicative of the threshold voltages of the memory cells defined by the address signals and the read command. The memory device 301 may transfer its analog data signals in parallel or serial fashion.

The analog data signals may also be transferred not as discrete voltage pulses, but as a substantially continuous stream of analog signals. In this situation, the read/write channel 305 may employ signal processing similar to that used in HDD accessing called PRML or partial response, maximum likelihood. In PRML processing of a traditional HDD, the read head of the HDD outputs a stream of analog signals representative of flux reversals encountered during a read operation of the HDD platter. Rather than attempting to capture the true peaks and valleys of this analog signal generated in response to flux reversals encountered by the read head, the signal is periodically sampled to create a digital representation of the signal pattern. This digital representation can then be analyzed to determine the likely pattern of flux reversals responsible for generation of the analog signal pattern. This same type of processing can be utilized with embodiments of the present disclosure. By sampling the analog signal from the memory device 301, PRML processing can be employed to determine the likely pattern of threshold voltages responsible for generation of the analog signal.

Figure 4:
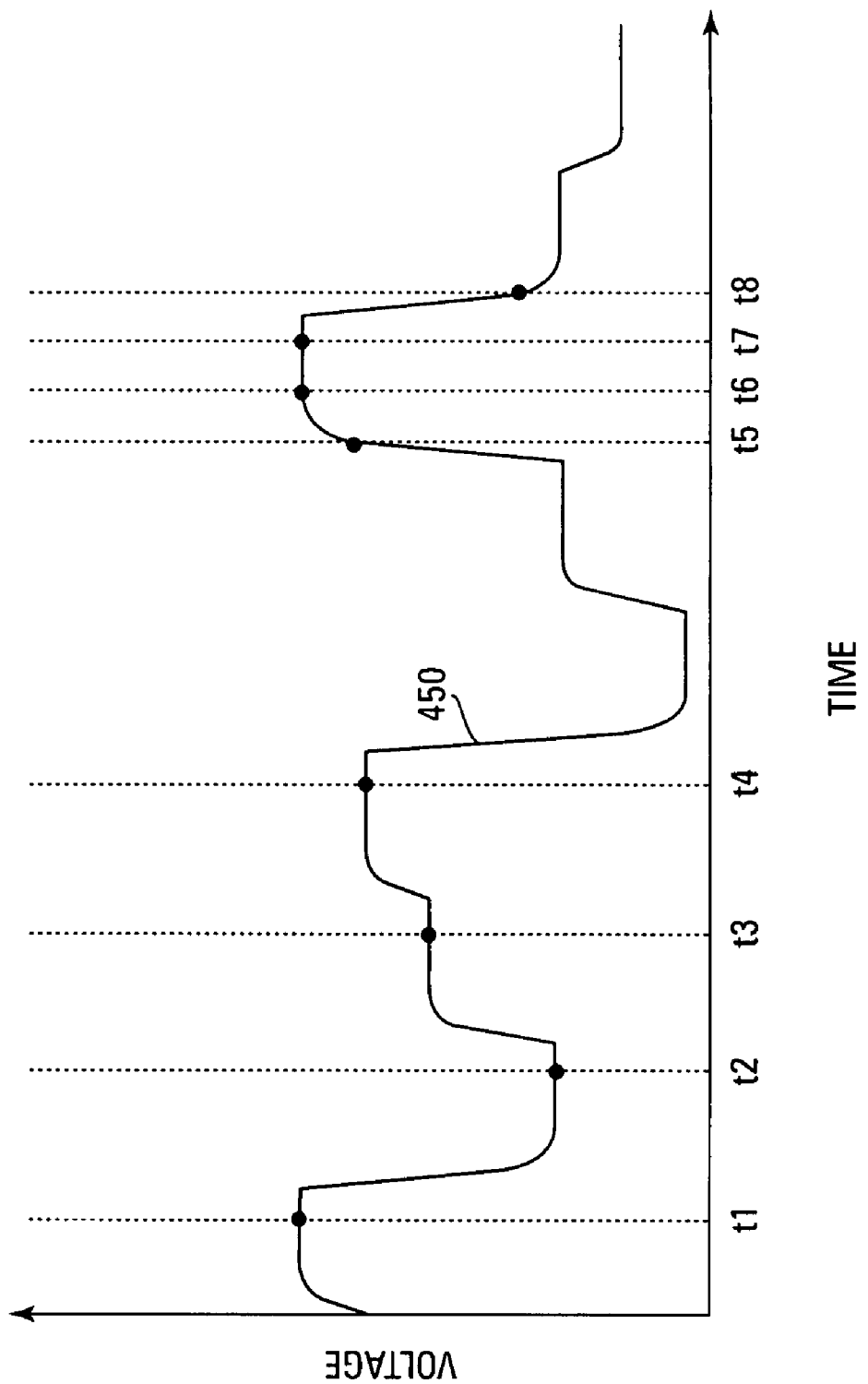
FIG. 4 is a depiction of a wave form showing conceptually a data signal as might be received from the memory device by a read/write channel in accordance with an embodiment of the disclosure.

FIG. 4 is a depiction of a wave form showing conceptually a data signal 450 as might be received from the memory device 301 by the read/write channel 305 in accordance with an embodiment of the disclosure. The data signal 450 could be periodically sampled and a digital representation of the data signal 450 can be created from the amplitudes of the sampled voltage levels. For one embodiment, the sampling could be synchronized to the data output such that sampling occurs during the steady-state portions of the data signal 450. Such an embodiment is depicted by the sampling as indicated by the dashed lines at times t1, t2, t3 and t4. However, if synchronized sampling becomes misaligned, values of the data samples may be significantly different than the steady-state values. In an alternate embodiment, sampling rates could be increased to allow determination of where steady-state values likely occurred, such as by observing slope changes indicated by the data samples. Such an embodiment is depicted by the sampling as indicated by the dashed lines at times t5, t6, t7 and t8, where a slope between data samples at times t6 and t7 may indicate a steady-state condition. In such an embodiment, a trade-off is made between sampling rate and accuracy of the representation. Higher sampling rates lead to more accurate representations, but also increase processing time. Regardless of whether sampling is synchronized to the data output or more frequent sampling is used, the digital representation can then be used to predict what incoming voltage levels were likely responsible for generating the analog signal pattern. In turn, the likely data values of the individual memory cells being read can be predicted from this expected pattern of incoming voltage levels.

Recognizing that errors will occur in the reading of data values from the memory device 301, the read/write channel 305 may include error correction. Error correction is commonly used in memory devices, as well as HDDs, to recover from expected errors. Typically, a memory device will store user data in a first set of locations and error correction code (ECC) in a second set of locations. During a read operation, both the user data and the ECC are read in response to a read request of the user data. Using known algorithms, the user data returned from the read operation is compared to the ECC. If the errors are within the limits of the ECC, the errors will be corrected.

Figure 5:
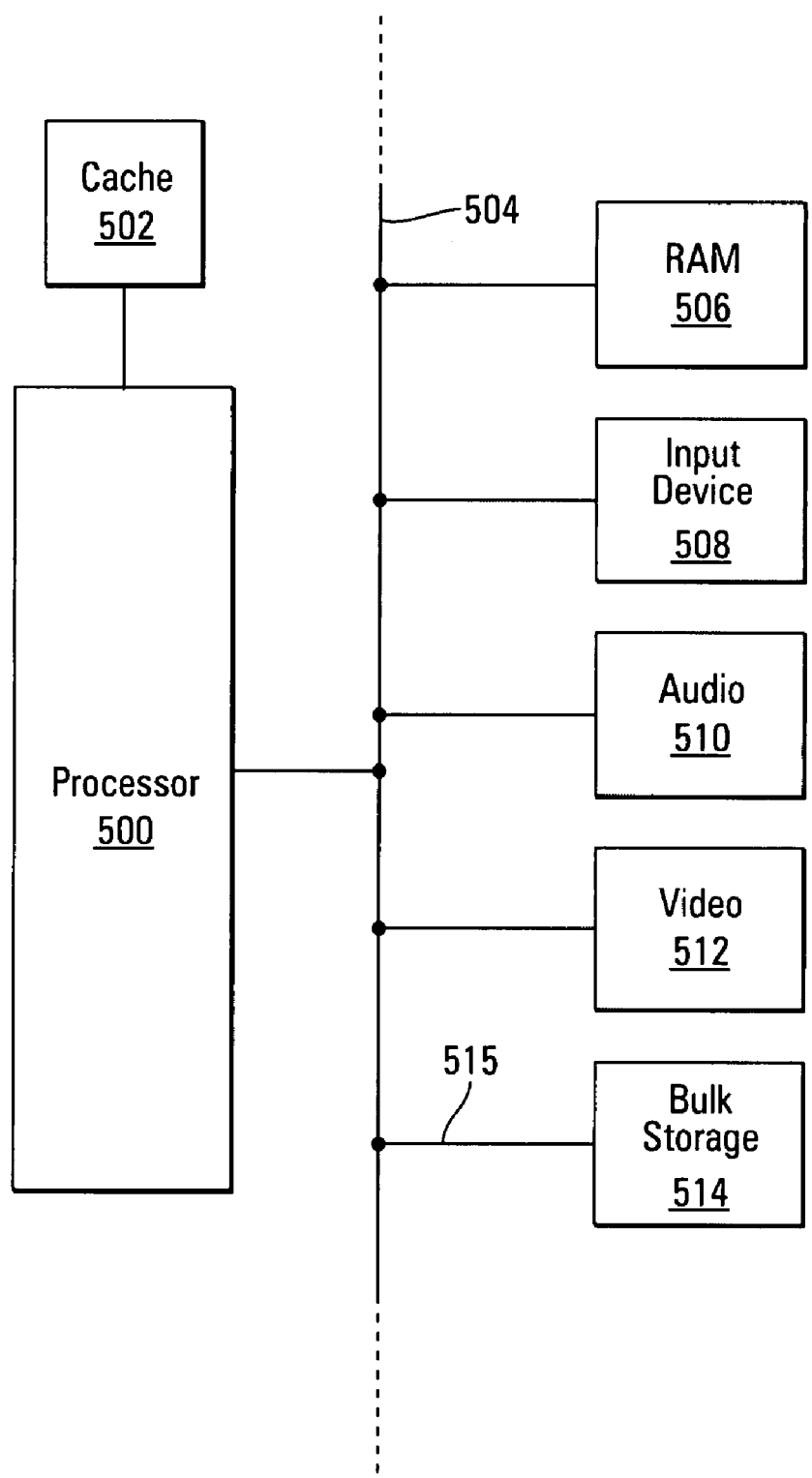
FIG. 5 is a block schematic of an electronic system in accordance with an embodiment of the disclosure.

FIG. 5 is a block schematic of an electronic system in accordance with an embodiment of the disclosure. Example electronic systems may include personal computers, PDAs, digital cameras, digital media players, digital recorders, electronic games, appliances, vehicles, wireless devices, mobile telephones and the like.

The electronic system includes a host processor 500 that may include cache memory 502 to increase the efficiency of the processor 500. The processor 500 is coupled to a communication bus 504. A variety of other devices may be coupled to the communication bus 504 under control of the processor 500. For example, the electronic system may include random access memory (RAM) 506; one or more input devices 508 such as keyboards, touch pads, pointing devices, etc.; an audio controller 510; a video controller 512; and one or more bulk storage devices 514. At least one bulk storage device 514 includes a digital bus interface 515 for communication with the bus 504, one or more memory devices in accordance with an embodiment of the disclosure having an analog interface for transfer of data signals representative of data patterns of two or more bits of data, and a signal processor adapted to perform digital-to-analog conversion of digital data signals received from the bus interface 515 and analog-to-digital conversion of analog data signals received from its memory device(s).

Source Follower Sensing of Memory Cells in NAND

As stated above, sensing threshold voltages of memory cells of memories can be accomplished in multiple manners. One or more embodiments of the present invention sense voltages in non-volatile NAND architecture memory arrays, such as NAND architecture Flash memory arrays, by operating the NAND string much like a source-follower. In a sensing operation (e.g., a read or verify operation) the programmed threshold voltage of a cell in a NAND string of a NAND architecture Flash memory array is sensed by applying an elevated voltage to the source line (such as Vcc), an elevated pass voltage (Vpass, such as Vcc or higher) is applied to the gates of the unselected cells of the string to operate them as pass gates and place them in a pass through mode of operation, and a read gate voltage (Vg) is applied to the gate of the selected cell to operate it in an active mode, even when the largest threshold voltages (Vt) are programmed into it. The selected memory cell sets a voltage on the coupled bit line (with current flowing through the string from the source line) that will be at the read gate voltage minus the threshold voltage of the cell (Vg−Vt). This voltage of the cell to be directly sensed utilizing an ADC (such as the read channel's ADC) against the known read gate voltage (Vg) or, alternatively, can be sampled and compared against a reference voltage, such as against the sampled target data voltage to verify the voltage programmed into the cell in a program operation.

As stated above, in the past, sensing of data stored in NAND Flash memory cells was done typically by applying a pass voltage (Vpass) to the unselected word lines of a NAND memory cell string to operate them as pass transistors and applying a read voltage (Vg) to the selected word line coupled to the gate of the memory cell selected to be sensed. A sense line e.g., a bit line) associated with the NAND string would be precharged to a known precharge voltage level and coupled to the NAND string. If the applied read voltage was higher than the Vt of cell, the selected transistor turns on and current flows to the source line, discharging the precharging voltage on the bit line, which is sensed by a charge sharing sense amplifier. In single logic level cell (SLC) implementations, this is typically a single sensing operation; if the cell turns on under the applied read voltage it is in an erased state (logical one), and if the cell does not turn on it is programmed (logical zero). In a multi-level cell implementation, the read voltage (Vg) is typically step changed in sequential sensing operations to determine the threshold voltage (Vt) of the cell. The cell turns on when a read voltage (Vg) at or above the threshold voltage (Vt) level programmed into it is applied to the word line, allowing determination of which logical window of the range of possible threshold values it was in, and thus allowing determination of the cell's corresponding programmed data value.

In analog circuits, field effect transistor (FET) source follower amplifiers are typically utilized as final stage analog amplifiers because of their low effective output resistance. In a source follower amplifier circuit, the drain is coupled to a power rail voltage source and the input is coupled to the control gate, while output of the amplifier is taken from the source. As the name implies, in source follower amplifiers the source follows the voltage of the input/control gate of the FET. This output is typically reduced by the threshold voltage of the FET (required to place the FET into active mode). While the output can be amplified by an amplification factor designed into the amplifier, source follower amplifiers are typically utilized as buffers.

Figure 6:
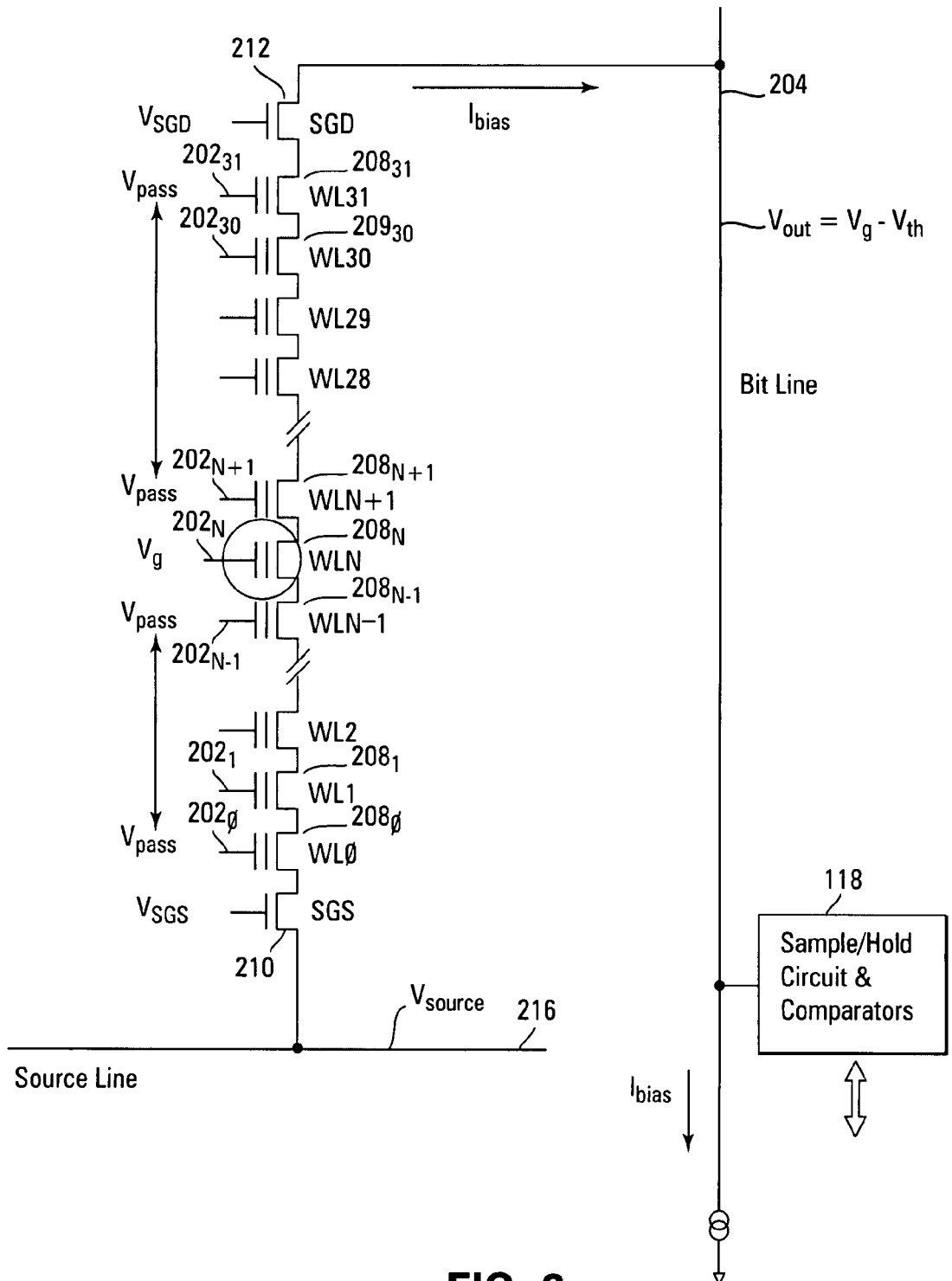
FIG. 6 detail a NAND array and voltage sense in accordance with an embodiment of the present invention.

FIG. 6 shows a schematic of a simplified NAND architecture Flash array of an embodiment of the present invention. It is noted that the NAND memory array of FIG. 6 is for illustrative purposes and should not be taken as limiting and that other NAND memory array embodiments of the present invention are possible and will be apparent to those skilled in the art with the benefit of the present disclosure.

In FIG. 6, a NAND string of an array is coupled to bit line 204 and source line 216. In the NAND memory string, a series of memory cells $208_0$-$208_{31}$ are coupled together source to drain to form the NAND string. It is noted that, while the NAND string of FIG. 6 is detailed as having 32 cells in it, NAND strings can have differing numbers of cells, including, but not limited to, 8, 16, 32, 64, or more cells. The word lines $202_X$ couple across the NAND strings of the array, coupling the control gates of adjacent memory cells $208_X$ enabling a single memory cell $208_X$ from adjacent memory strings to be selected. In each NAND memory string, impurity (N+ typically) doped regions are formed between each gate insulator stack to form the source and drain regions of the adjacent memory cells $208_X$ of the string, which additionally operate as connectors to couple the cells of the NAND string together. Each NAND memory string is coupled to select gates 210, 212 that are formed at either end of each NAND string and selectively couple opposite ends of each NAND string to a bit line 204 and a source line 216. The select gates 210, 212 are each coupled to select gate control lines and control the coupling of the NAND string to an associated bit line 204 and source line 216, respectively.

In a source follower sense operation in FIG. 6, an elevated read pass voltage (Vpass) is applied to the word lines of the unselected memory cells ($208_{31}$-$208_{N+1}$, $208_{N-1}$-$208_0$, coupled to word lines $202_{31}$-$202_{N+1}$, $202_{N-1}$-$202_0$), allowing them to pass current in a manner that is unrestricted by their stored data values. An elevated voltage, Vsource (such as Vcc or higher), is applied to the source line 216, while select gate voltages ($V_{SGD}$ and $V_{SGS}$) are also applied to the gates of the select gate FETs, coupling the NAND string to the source line 216 and bit line 204, respectively. A read gate voltage (Vg) is applied to the word line $202_N$ connected to the selected memory cell $208_N$ to operate it in an active mode. Current (I bias) then flows through the NAND string from the source line 216 to the bit line 204 through the selected memory cell $208_N$, which operates as if it were a source follower amplifier, raising the voltage of the column bit line 204 to that of the applied read voltage minus the programmed threshold voltage (Vg−Vt) of the selected cell $208_N$. As the applied read gate voltage is known, the threshold voltage (Vt) of the selected cell $208_N$ can be directly sensed from the bit line 204 by an analog to digital converter (ADC) or an indication of the threshold voltage can be sampled and held by a capacitor in a sample and hold circuit 118 for later comparison or transfer from the memory device. It is noted that in an alternate embodiment, the bit line 204 can be precharged to a known voltage, such as in intermediate voltage or Vcc/2, to help increase the speed of the sensing operation.

As also stated above, in programming NAND architecture Flash/EEPROM memories of embodiments of the present invention memory cells are programmed with analog voltage levels by applying a programming voltage (e.g., a series of programming voltage pulses) to the control gates of the selected memory cells of one or more NAND strings to place charge into their floating gates and alter the threshold voltage. The programmed threshold voltages can be then verified against the target voltage levels stored in the sample and hold circuit 118 by sensing the selected memory cells in a verify operation, such as by the foregoing source follower sensing. The memory cells that are at or over their target voltage can be inhibited from further programming by the application of an elevated voltage to their channels (such as through the coupled bit line 204), while the cells that failed verification (had a Vt that was below the target voltage) have their channels coupled to a low programming voltage (typically by coupling the channel to ground through the bit line 204) and are subjected to additional programming pulses (at the programming word line voltage or at an increased programming voltage). This program and verify cycle can be repeated until the target voltages are successfully programmed or repeated until a selected number of iterations have passed without all the target voltages being successfully verified and the programming operation is deemed to have failed.

As with the read operation, in a verify operation, an elevated read pass voltage (Vpass) is applied to the word lines of the unselected memory cells ($208_{31}$-$208_{N+1}$, $208_{N-1}$-

$208_0$), allowing them to pass current in a manner that is unrestricted by their stored data values and an elevated voltage, Vsource, is applied to the source line 216. A verify read gate voltage (Vg) is applied to the word line $202_N$ connected to the memory cell $208_N$ to operate the selected memory cell $208_N$ in an active mode. Current (I bias) then flows through the NAND string, raising the voltage of the column bit line 204 to that of the applied read voltage minus the programmed threshold voltage (Vout=Vg−Vt) of the selected cell $208_N$. The bit line voltages expressed by the NAND strings on the bit lines 204 can then be sampled, such as by the sample and hold circuit 118, and compared against the target voltages or indications of the target voltages to select the cells programmed and inhibited in the next program cycle. In this comparison, the sampled voltage of the bit line 204 might be first converted to a voltage indicative of the threshold voltage (Vt) of the selected memory cell $208_N$ by subtracting the bit line voltage from the read gate voltage (Vg−Vout=Vt) and then compared against the target voltage level stored in the sample and hold circuit 118.

It is also noted that, during sensing, the unselected memory cells ($208_{31}$-$208_{N+1}$ on the source-side of the selected cell $208_N$, and $208_{N-1}$-$208_0$ on the drain-side) do not act as perfect pass gates and introduce an additional voltage drop into the sensing operation due to their internal resistance. The sensing error is due mainly to the resistance of the source-side unselected memory cells $208_{31}$-$208_{N+1}$, and only secondarily to the resistance of the drain-side cells $208_{N-1}$-$208_0$, the voltage expressed on the bit line 204 is more accurately portrayed as that of the applied read voltage minus the programmed threshold voltage minus the resistance drop of the source-side cells (Vout=Vg−Vt−Rsource-side*I bias). This resistance can be compensated for by programming the threshold voltage of the selected memory cell in a program-verify cycle that compensates for the IR drop of the unselected cells by matching the measured threshold voltage (Vt) of the cell $208_N$ as measured on the bit line 204 to a target voltage held in the sample and hold circuit 118 (so that the voltage measured on the bit line 204 includes the voltage due to the IR drop of the unselected source-side memory cells, Rsource-side*I bias, in addition to the programmed threshold voltage of the memory cell, Vt, effectively dropping the programmed threshold voltage down to compensate for the IR drop of the source-side resistance). This sensing error can be reduced through selecting the programming sequence of the memory cells of the string to ensure a stable resistance pattern in the unselected cells when programming the selected memory cell $208_N$, in particular, that of the resistance presented by the source-side memory cells ($208_{N-1}$-$208_0$).

Figure 7A:
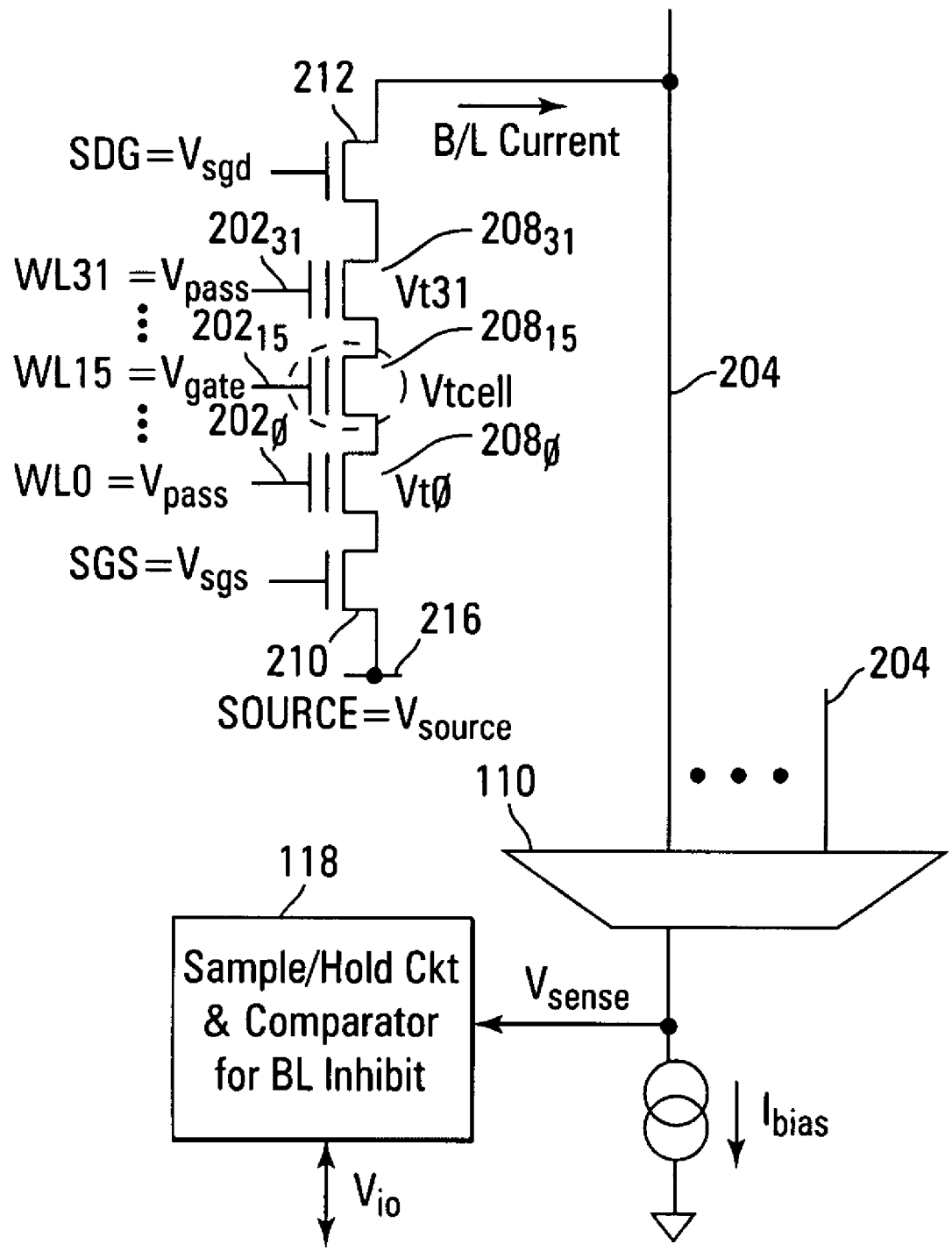
FIGS. 7A and 7B detail a NAND array and sample and hold circuit in accordance with an embodiment of the present invention.
Figure 7B:
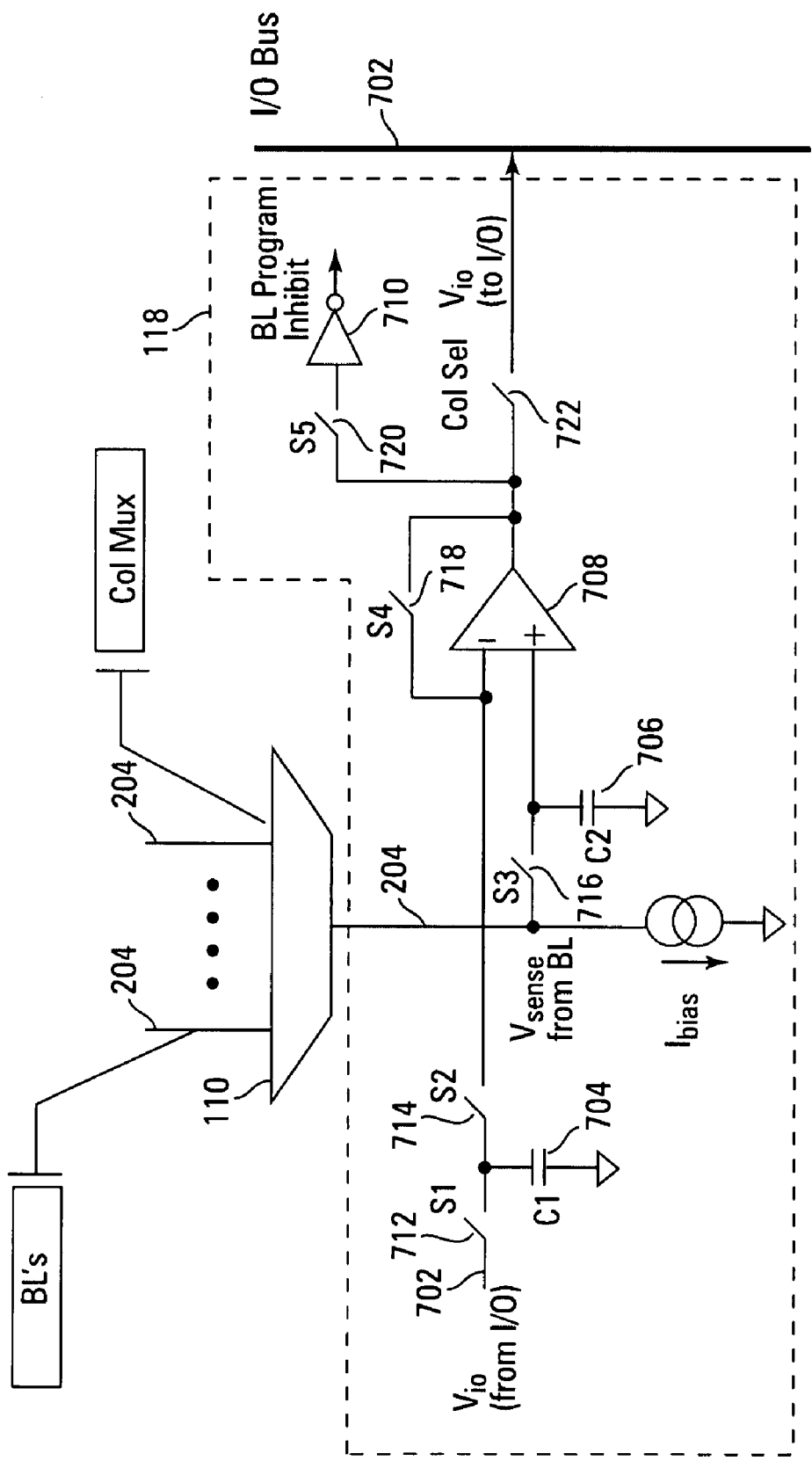

FIGS. 7A and 7B detail a schematic of a simplified NAND architecture array and a sample and hold circuit of one embodiment of the present invention. In FIG. 7A, a NAND string of a plurality of NAND strings of an array contains a series of memory cells $208_0$-$208_{31}$ that are coupled together source to drain to form the NAND string. The NAND string is also coupled to bit line 204 and source line 216 through select gates 210, 212, respectively. The word lines $202_X$ couple across the NAND strings of the array, coupling the control gates of adjacent memory cells $208_X$ enabling a single memory cell $208_X$ from adjacent memory strings to be selected. The bit line 204 is coupled through a column multiplexer of the column decode circuit 110 to a current bias source and a sample and hold circuit 118. The sample and hold circuit 118 also incorporates a comparator and a bit line inhibit circuit.

FIG. 7B details a sample and hold circuit 118 of one embodiment of the present invention. In FIG. 7B, the sample and hold circuit 118 is coupled to a bit line 204 through the column multiplexer (also known as a column mux) of the column decode circuit 110. The sample and hold circuit 118 is also connected to I/O Bus 702. Internal to the sample and hold circuit 118, a bit line sample capacitor C2 706 is coupled to the bit line 204 selected by the column multiplexer 110 by switch S3 716 (typically a FET transistor that is operated as a pass gate or switch). In addition, the sample and hold circuit 118 also contains an incoming data sample capacitor C1 704, that can be coupled to the I/O Bus 702 through switch S1 712 to sample incoming data, typically input as an analog voltage level. An amplifier (or operational amplifier) 708 is also incorporated in the sample and hold circuit 118. The operational amplifier 708, depending on the mode of operation of the memory, can be configured and operated as either a comparator to compare the voltages of capacitors C1 704 and C2 706, or as a unity amplifier/output buffer to output the sampled bit line voltage from capacitor C2 706 on to the I/O bus 702. To operate as a comparator, capacitor C1 704 is coupled to an input of the operational amplifier 708 through switch S2 714, while switch S4 718 is opened to disable the feedback path of the amplifier 708. The voltage of capacitor C1 704 is then compared against the voltage of capacitor C2 706 (which is coupled to the other input of the operational amplifier 708) by an internal differential amplifier and the high open circuit gain of the operational amplifier 708 with the results expressed on the output. To operate as an output buffer, the switch S2 714 is opened to disconnect capacitor C1 704 and switch S4 718 is closed to enable the feedback path and allow the operation amplifier 708 to act as a unity gain amplifier, buffering the voltage on capacitor C2 706 and expressing it on the amplifier's 708 output.

In a sense operation in the memory of FIGS. 7A and 7B, bias conditions are applied to the NAND string by applying an elevated read pass voltage (Vpass) to the word lines of the unselected memory cells ($208_{31}$-$208_{N+1}$, $208_{N-1}$-$208_0$), allowing them to pass current in a manner that is unrestricted by their stored data values. An elevated voltage, Vsource (such as Vcc or higher), is applied to the source line 216, while select gate voltages ($V_{SGD}$ and $V_{SGS}$) are also applied to the gates of the select gate FETs, coupling the NAND string to the source line 216 and bit line 204, respectively. A read gate voltage (Vgate) is applied to the word line $202_N$ connected to the selected memory cell $208_N$ (selected as cell $208_{15}$ in the example of FIG. 7A) to operate it in an active mode. Current (B/L current) then flows through the NAND string from the source line 216 to the bit line 204 through the selected memory cell $208_N$, raising the voltage of the column bit line 204 to that of the applied read voltage minus the programmed threshold voltage (Vgate−Vt) of the selected cell $208_N$. The bit line 204 is selected by the column multiplexer of the column address decoder circuit 110 and coupled to the sample and hold circuit 118. In preparation for sensing, the sample and hold circuit 118 turns off switches S1 712 and S2 714 to isolate capacitor C1 704, capacitor C2 706 is also isolated from the bit line 204 by turning off switch S3 716. In addition, switch S5 720 is also turned off to isolate the bit line inhibit circuit 710, while switch S4 718 is turned on to couple the operational amplifier 708 as an output buffer/unity gain amplifier. Once the voltage (Vsense or Vout) on the selected bit line 204 has stabilized, it is sampled by the sample and hold circuit 118 by turning on switch S3 716 and coupling capacitor C2 706 to the bit line 204. The voltage of the bit line 204, as sampled by the capacitor C2 706, is buffered by the operational amplifier 708 and can then be coupled to the I/O Bus 702 for output by closing switch Col_Sel 722. It is noted that once the bit line voltage (Vsense) has been sampled by capacitor C2 706, switch S3 716 can be turned off to isolate the capacitor from the bit line 204, allowing the array to begin the next sensing cycle while the sampled voltage is read out of the memory. It is also noted, as stated above, that the selected memory cell threshold voltage can be determined from the sampled bit line voltage (Vsense) by subtracting the gate voltage (Vgate) from the sampled bit line voltage (Vsense). E.g., Cell Vt=Vgate−Vsense.

In a program and verify operation in the memory of FIGS. 7A and 7B, an incoming data voltage is first sampled and held in capacitor C1 704 as a target or desired threshold voltage by turning on switch S1 712 to couple capacitor C1 704 to the I/O Bus 702. Switch S2 714 is typically turned off during this process. After the capacitor C1 704 has charged the voltage expressed on the I/O Bus 702, switch S1 712 is then turned off to capture the desired incoming data voltage. A memory cell $208_N$ (selected as cell $208_{15}$ in the example of FIG. 7A) is then selected and programmed by applying a programming voltage pulse to its control gate $202_N$ and applying a ground or low voltage to the channel to place charge onto its floating gate and alter the threshold voltage. The threshold voltage of the selected memory cell $208_N$ is then verified by re-selecting and sensing the selected memory cell $208_N$ and comparing the sensed threshold voltage against the target voltage stored in capacitor C1 704 in a verify operation.

To accomplish the verify operation, switch S4 718 is turned off to configure the operational amplifier 708 as a comparator and coupling the output of the operational amplifier 708 to the bit line inhibit circuit 710 by turning on switch S5 720 and confirming that the "Col_Sel" switch 722 is off (to disconnect the output of the operational amplifier 708 from the I/O Bus 702). In addition, switch S1 712 is left in an off state, while switch S2 714 is turned on to couple target voltage stored on the capacitor C1 704 to an input of the operational amplifier 708. Sensing bias conditions are applied to the NAND string by applying an elevated read pass voltage (Vpass) to the word lines of the unselected memory cells ($208_{31}$-$208_{N+1}$, $208_{N-1}$-$208_0$), while select gate voltages ($V_{SGD}$ and $V_{SGS}$) are also applied to the gates of the select gate FETs to couple the NAND string to the source line 216 and bit line 204, respectively. An elevated voltage, Vsource, is applied to the source line 216 and a read gate voltage (Vgate) is applied to the word line $202_N$ connected to the selected memory cell $208_N$ to operate it in an active mode. Current (B/L current) flowing through the NAND string from the source line 216 to the bit line 204, raises the voltage of the column bit line 204 to that of the applied read voltage minus the programmed threshold voltage (Vgate−Vt) of the selected cell $208_N$. The bit line 204 is selected by the column multiplexer of the column address decoder circuit 110 and coupled to the sample and hold circuit 118. Once the voltage (Vsense or Vout) on the selected bit line 204 has stabilized, it is sampled by the sample and hold circuit 118 by turning on switch S3 716 and coupling capacitor C2 706 to the bit line 204. The voltage of the bit line 204, as sampled by the capacitor C2 706. The operational amplifier, configured as a comparator, then compares the target voltage and the sensed bit line voltages coupled to its inputs from capacitors C1 704 and C2 706, respectively. If the sensed voltage of the selected memory cell $208_N$ (as sampled and held on capacitor C2 706) is lower than that of the target voltage (as sampled and held in capacitor C1 704), the operational amplifier 708 output is high and the output of the inverter of the coupled bit line program inhibit circuit 710 is thus low, indicating further programming pulses are required. If the sensed voltage of the selected memory cell $208_N$, sampled and held on capacitor C2 706, is higher than that of the target voltage held in capacitor C1 704, the operational amplifier 708 output is low and the output of the inverter of the coupled bit line program inhibit circuit 710 is high, indicating that no further programming pulses are required. In one embodiment, this output from the bit line program inhibit circuit 710 is utilized to set the voltage coupled to the channel of the selected memory cell, setting it at a low or ground potential voltage (program) or high voltage (program-inhibit, such as Vcc), depending on if the output of the bit line program inhibit circuit 710 is low or high, respectively. This program and verify cycle can be repeated until the target voltages are successfully programmed or repeated until a selected number of iterations have passed without all the target voltages being successfully verified and the programming operation is deemed to have failed. It is also noted that in one embodiment, the target voltage is represented as the desired Vsense to be sensed and not the direct memory cell threshold voltage (e.g., Cell Vt=Vgate−Vsense, thus Vtarget=Vsense=Vgate−Cell Vt). It is also noted that in another embodiment Vsense, sampled and stored in capacitor C2 706, can be first converted to the sensed threshold voltage of the selected memory cell $208_N$ by subtracting Vgate from it before comparison with the target threshold voltage stored in capacitor C1 704.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

CONCLUSION

An analog voltage NAND architecture non-volatile memory data read/verify process and circuits have been described that senses analog voltages in non-volatile cells utilizing source follower voltage sensing. In a source follower sensing or read operation the programmed threshold voltage of a cell in a NAND string of a NAND architecture Flash memory array is read by applying an elevated voltage to the source line (such as Vcc), an elevated pass voltage (Vpass) is placed on the gates of the unselected cells of the string to place them in a pass through mode of operation, and a read gate voltage (Vg) is applied to the gate of the selected cell. The selected memory cell operates as a source follower amplifier to set a voltage on the coupled bit line at the read gate voltage minus the threshold voltage of the cell (Vg−Vt) with current flowing through the string from the source line. This allows the voltage of the cell to be directly sensed utilizing an ADC (such as the read channel's ADC) against the known read gate voltage (Vg) or, alternatively, sampled and compared against a reference voltage, such as against the sampled target data voltage to verify the voltage programmed into the cell in a program operation.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A NAND architecture non-volatile memory device, comprising:
 a NAND memory array having a plurality of non-volatile memory cells arranged in a plurality of NAND strings; and
 circuitry for control and/or access of the plurality of non-volatile memory cells of the NAND memory array;
 wherein the NAND architecture non-volatile memory device is adapted to sense a threshold voltage of a selected memory cell of a NAND memory cell string of the NAND memory array by,
  coupling the NAND string to a bit line and a source line,
  applying an elevated source voltage (Vsource) to the source line,
  applying a pass voltage (Vpass) to one or more word lines coupled to control gates on one or more unselected memory cells of the NAND string,
  applying a read gate voltage (Vg) to a word line coupled to a control gate of the selected memory cell, and
  sensing a voltage expressed on the coupled bit line indicative of the read gate voltage (Vg) minus the threshold voltage (Vt) of the selected memory cell of the NAND memory cell string.

2. The NAND architecture non-volatile memory device of claim 1, wherein the NAND architecture non-volatile memory device, while sensing a threshold voltage of a selected memory cell of a NAND memory cell string of the NAND memory array, is further adapted to,
 apply select voltage $V_{SGD}$ to a drain select gate of the NAND memory cell string;
 apply select voltage $V_{SGS}$ to a source select gate of the NAND memory cell string; and
 apply a bias current to the bit line of the NAND memory cell string.

3. The NAND architecture non-volatile memory device of claim 1, wherein the NAND architecture non-volatile memory device is adapted to amplify and/or buffer the sensed threshold voltage prior to transferring to an external device.

4. The NAND architecture non-volatile memory device of claim 1, wherein the NAND architecture non-volatile memory device is adapted to sample the voltage expressed on the bit line with a sample and hold circuit, and where the sample and hold circuit comprises one or more capacitors to store the sampled voltage.

5. The NAND architecture non-volatile memory device of claim 4, wherein the sample and hold circuit of the NAND architecture non-volatile memory device is adapted to compare the sampled bit line voltage against a target analog voltage.

6. The NAND architecture non-volatile memory device of claim 1, wherein the NAND architecture non-volatile memory device is adapted to receive an analog data signal indicative of a desired threshold voltage of a selected memory cell.

7. A NAND architecture non-volatile memory device, comprising:
 a NAND memory array having a plurality of non-volatile memory cells arranged in a plurality of NAND strings; and
 circuitry for control and/or access of the plurality of non-volatile memory cells of the NAND memory array;
 wherein the NAND architecture non-volatile memory device is adapted to sense a threshold voltage of a selected memory cell of a NAND memory cell string of the NAND memory array by,
  coupling the NAND string to a bit line and a source line,
  applying an elevated source voltage (Vsource) to the source line,
  applying a pass voltage (Vpass) to one or more word lines coupled to control gates on one or more unselected memory cells of the NAND string, and
  applying a read gate voltage (Vg) to a word line coupled to a control gate of the selected memory cell;
 wherein the NAND architecture non-volatile memory device is adapted to receive an analog data signal indicative of a desired threshold voltage of a selected memory cell; and
 wherein the NAND architecture non-volatile memory device is adapted to program the selected memory cell in a program and verify cycle by,
  storing an indication of the desired threshold voltage of the selected memory cell in a sample and hold circuit;
  programming the selected memory cell in a program cycle by applying a programming voltage to the control gate of the selected memory cell and a program low voltage to a channel of the selected memory cell;
  sensing the threshold voltage of the selected memory cell by,
   coupling the NAND string to a bit line and a source line,
   applying an elevated source voltage (Vsource) to the source line,
   applying a pass voltage (Vpass) to one or more word lines coupled to control gates on one or more unselected memory cells of the NAND string, and
   applying a read gate voltage (Vg) to a word line coupled to a control gate of the selected memory cell;
  comparing an indication of the sensed threshold voltage of the selected memory cell to the stored indication of the desired threshold voltage of the selected memory cell; and
  increasing the threshold voltage of the selected memory cell by applying a further program cycle if the sensed threshold voltage is found to be less than the desired threshold voltage.

8. The NAND architecture non-volatile memory device of claim 7, wherein sensing the threshold voltage of the selected memory cell and comparing the sensed threshold voltage of the selected memory cell to the stored desired threshold voltage of the selected memory cell further comprises reading a voltage expressed on the coupled bit line (Vout) indicative of the read gate voltage (Vg) minus the threshold voltage (Vt) of the selected memory cell of the NAND memory cell string, subtracting the voltage expressed on the coupled bit line (Vout) from the read gate voltage (Vg) to get a voltage indicative of the threshold voltage (Vt) of the selected memory cell, and comparing the voltage indicative of the threshold voltage of the selected memory cell (Vt) to the stored indication of the desired threshold voltage.

9. A NAND architecture non-volatile memory device, comprising:
 a NAND memory array having a plurality of non-volatile memory cells arranged in a plurality of NAND strings; and
 circuitry for control and/or access of the plurality of non-volatile memory cells of the NAND memory array;
 wherein the NAND architecture non-volatile memory device is adapted to sense a threshold voltage of a selected memory cell of a NAND memory cell string of the NAND memory array by,
  coupling the NAND string to a bit line and a source line, applying an elevated source voltage (Vsource) to the source line, applying a pass voltage (Vpass) to one or more word lines coupled to control gates on one or more unselected memory cells of the NAND string, and applying a read gate voltage (Vg) to a word line coupled to a control gate of the selected memory cell; and wherein the NAND architecture non-volatile memory device is adapted to sense a voltage expressed on the coupled bit line indicative of the threshold voltage of the selected memory cell of the NAND memory cell string by sampling the expressed voltage on the bit line with an analog to digital converter (ADC).

10. A system, comprising:

a host coupled to a NAND architecture Flash memory device, the NAND architecture Flash memory device comprising, a NAND architecture non-volatile memory array having a plurality of memory blocks;

wherein the NAND architecture Flash memory device is adapted to receive and transmit analog data signals indicative of data values of two or more bits of information; and wherein the NAND architecture Flash memory device is adapted to sense a threshold voltage indicative of data values of two or more bits of information from a selected memory cell of a NAND memory cell string of the NAND memory array in a source follower read operation by, coupling the NAND string to a bit line and a source line, applying an elevated source voltage (Vsource) to the source line, applying a pass voltage (Vpass) to one or more word lines coupled to control gates on one or more unselected memory cells of the NAND string, applying a read gate voltage (Vg) to a word line coupled to a control gate of the selected memory cell, and sampling a voltage (Vout) expressed on the bit line indicative of the read gate voltage (Vg) minus the threshold voltage (Vt) of the selected memory cell.

11. A method of sensing a threshold voltage from a selected memory cell of a NAND memory cell string of a non-volatile memory device, comprising:

coupling the NAND memory cell string to a bit line and a source line;

applying an elevated source voltage (Vsource) to the source line;

applying a pass voltage (Vpass) to one or more word lines coupled to control gates on one or more unselected memory cells of the NAND memory cell string, and applying a read gate voltage (Vg) to a word line coupled to a control gate of the selected memory cell of the NAND memory cell string; and sensing a voltage expressed on the coupled bit line indicative of the read gate voltage (Vg) minus the threshold voltage (Vt) of the selected memory cell of the NAND memory cell string.

12. The method of claim 11, further comprising:

determining a voltage level indicative of the threshold voltage level of the selected memory cell from the memory device.

13. The method of claim 12, further comprising:

transmitting the voltage level indicative of the threshold voltage level of the selected memory cell from the memory device.

14. The method of claim 12, wherein determining a voltage level indicative of the threshold voltage of the selected memory cell further comprises determining the voltage level indicative of the threshold voltage by subtracting the voltage expressed on the coupled bit line (Vout) from the read gate voltage (Vg).

15. The method of claim 12, further comprising:

generating two or more digital data signals corresponding to a data bit pattern represented by the voltage level indicative of the threshold voltage of the selected memory cell; and transmitting the digital data signals to a host processor.

16. The method of claim 11, further comprising:

receiving an analog data signal indicative of a desired threshold voltage of a selected memory cell of a NAND memory cell string;

storing the desired threshold voltage of the selected memory cell in a sample and hold circuit;

programming the selected memory cell in a program cycle by applying a programming voltage to the control gate of the selected memory cell and a program low voltage to a channel of the selected memory cell;

reading the threshold voltage of the selected memory cell by, coupling the NAND memory cell string to a bit line and a source line;

applying an elevated source voltage (Vsource) to the source line;

applying a pass voltage (Vpass) to one or more word lines coupled to control gates on one or more unselected memory cells of the NAND memory cell string, and applying a read gate voltage (Vg) to a word line coupled to a control gate of the selected memory cell of the NAND memory cell string; and reading a voltage level indicative of the threshold voltage of the selected memory cell from the bit line;

comparing the threshold voltage of the selected memory cell to the stored desired threshold voltage of the selected memory cell; and increasing the threshold voltage of the selected memory cell by applying a further program cycle if the sensed threshold voltage of the selected cell is found to be less than the stored desired threshold voltage.

17. The method of claim 16, wherein reading a voltage level indicative of the threshold voltage of the selected memory cell on the bit line and comparing the threshold voltage of the selected memory cell to the stored desired threshold voltage of the selected memory cell further comprises reading a voltage expressed on the coupled bit line (Vout) indicative of the read gate voltage (Vg) minus the threshold voltage (Vt) of the selected memory cell of the NAND memory cell string, subtracting the voltage expressed on the coupled bit line (Vout) from the read gate voltage (Vg) to get a voltage indicative of the threshold voltage (Vt) of the selected memory cell, and comparing the voltage indicative of the threshold voltage (Vt) of the selected memory cell to the stored desired threshold voltage of the selected memory cell.

18. A method of sensing a threshold voltage from a selected memory cell of a NAND memory cell string of a non-volatile memory device, comprising:

coupling the NAND memory cell string to a bit line and a source line;

applying an elevated source voltage (Vsource) to the source line;

applying a pass voltage (Vpass) to one or more word lines coupled to control gates on one or more unselected memory cells of the NAND memory cell string, and applying a read gate voltage (Vg) to a word line coupled to a control gate of the selected memory cell of the NAND memory cell string; and reading a voltage level indicative of the threshold voltage of the selected memory cell from the bit line;

wherein reading a voltage level indicative of the threshold voltage of the selected memory cell from the bit line further comprises one of sensing a voltage level indicative of the threshold voltage of the selected memory cell from the bit line with an analog to digital converter (ADC) and sampling a voltage level indicative of the threshold voltage of the selected memory cell from the bit line in a sample and hold circuit.

19. A method of sensing a threshold voltage from a selected memory cell of a NAND memory cell string of a non-volatile memory device, comprising:

coupling the NAND memory cell string to a bit line and a source line;

applying an elevated source voltage (Vsource) to the source line;

applying a pass voltage (Vpass) to one or more word lines coupled to control gates on one or more unselected memory cells of the NAND memory cell string, and applying a read gate voltage (Vg) to a word line coupled to a control gate of the selected memory cell of the NAND memory cell string;

reading a voltage level indicative of the threshold voltage of the selected memory cell from the bit line;

receiving an analog data signal indicative of a desired threshold voltage of a selected memory cell of a NAND memory cell string;

storing the desired threshold voltage of the selected memory cell in a sample and hold circuit;

programming the selected memory cell in a program cycle by applying a programming voltage to the control gate of the selected memory cell and a program low voltage to a channel of the selected memory cell;

reading the threshold voltage of the selected memory cell by, coupling the NAND memory cell string to a bit line and a source line;

applying an elevated source voltage (Vsource) to the source line;

applying a pass voltage (Vpass) to one or more word lines coupled to control gates on one or more unselected memory cells of the NAND memory cell string, and applying a read gate voltage (Vg) to a word line coupled to a control gate of the selected memory cell of the NAND memory cell string; and reading a voltage level indicative of the threshold voltage of the selected memory cell from the bit line;

comparing the threshold voltage of the selected memory cell to the stored desired threshold voltage of the selected memory cell; and increasing the threshold voltage of the selected memory cell by applying a further program cycle if the sensed threshold voltage of the selected cell is found to be less than the stored desired threshold voltage.

20. The method of claim 19, wherein reading a voltage level indicative of the threshold voltage of the selected memory cell on the bit line and comparing the threshold voltage of the selected memory cell to the stored desired threshold voltage of the selected memory cell further comprises reading a voltage expressed on the coupled bit line (Vout) indicative of the read gate voltage (Vg) minus the threshold voltage (Vt) of the selected memory cell of the NAND memory cell string, subtracting the voltage expressed on the coupled bit line (Vout) from the read gate voltage (Vg) to get a voltage indicative of the threshold voltage (Vt) of the selected memory cell, and comparing the voltage indicative of the threshold voltage (Vt) of the selected memory cell to the stored desired threshold voltage of the selected memory cell.

21. A method of sensing a threshold voltage from a selected memory cell of a NAND string, comprising:

applying an elevated source voltage (Vsource) to a source line coupled to the NAND string;

applying a pass voltage (Vpass) to one or more word lines coupled to control gates on one or more unselected memory cells of the NAND string, and applying a read gate voltage (Vg) to a word line coupled to a control gate of a selected memory cell of the NAND string; and sensing a voltage level indicative of the threshold voltage of the selected memory cell from a bit line coupled to the NAND string;

wherein sensing a voltage level indicative of the threshold voltage of the selected memory cell from the bit line comprises sensing a voltage expressed on the coupled bit line indicative of the read gate voltage (Vg) minus the threshold voltage (Vt) of the selected memory cell of the NAND memory cell string.

22. The method of claim 21, wherein sensing a voltage level indicative of the threshold voltage of the selected memory cell from the bit line further comprises sensing a voltage expressed on the bit line (Vout) indicative of the read gate voltage (Vg) minus the threshold voltage (Vt) of the selected memory cell of the NAND string and subtracting the voltage expressed on the bit line (Vout) from the read gate voltage (Vg).

23. A method of sensing a threshold voltage from a selected memory cell of a NAND string, comprising:

applying an elevated source voltage (Vsource) to a source line coupled to the NAND string;

applying a pass voltage (Vpass) to one or more word lines coupled to control gates on one or more unselected memory cells of the NAND string, and applying a read gate voltage (Vg) to a word line coupled to a control gate of a selected memory cell of the NAND string; and sensing a voltage level indicative of the threshold voltage of the selected memory cell from a bit line coupled to the NAND string;

wherein sensing a voltage level indicative of the threshold voltage of the selected memory cell from the bit line further comprises one of sensing a voltage level indicative of the threshold voltage of the selected memory cell from the bit line with one of an analog to digital converter (ADC) and sampling a voltage level indicative of the threshold voltage of the selected memory cell with a capacitor of a sample and hold circuit.

* * * * *